United States Patent [19]

Toriumi et al.

[11] Patent Number: 4,792,516

[45] Date of Patent: Dec. 20, 1988

[54] PHOTOSENSITIVE COMPOSITION

[75] Inventors: Minoru Toriumi; Hiroshi Shiraishi, both of Hachioji; Ryotaro Irie, Tokyo; Shigeru Koibuchi, Hitachi, all of Japan

[73] Assignee: Hitachi Chemical Company, Tokyo, Japan

[21] Appl. No.: 373

[22] Filed: Jan. 5, 1987

[30] Foreign Application Priority Data

Jan. 9, 1986 [JP] Japan ................................ 61-1331

[51] Int. Cl.[4] .................. G03C 1/60; G03C 1/727
[52] U.S. Cl. ...................................... 430/196; 430/165; 430/167; 430/191; 430/192; 430/197; 430/325; 430/326; 430/330; 430/331
[58] Field of Search ............... 430/197, 325, 331, 167, 430/196

[56] References Cited

U.S. PATENT DOCUMENTS

| | | | |
|---|---|---|---|
| 4,215,191 | 7/1980 | Kwok | 430/197 |
| 4,411,981 | 10/1983 | Minnezaki | 430/299 |
| 4,423,138 | 12/1983 | Guild | 430/331 |
| 4,500,629 | 2/1985 | Irving et al. | 430/197 |
| 4,546,066 | 10/1985 | Field et al. | 430/325 |
| 4,565,768 | 1/1986 | Nonogaki et al. | 430/197 |
| 4,696,891 | 9/1987 | Guzzi | 430/325 |
| 4,728,594 | 3/1988 | Nonogaki et al. | 430/197 |

FOREIGN PATENT DOCUMENTS 57-205190  12/1982  Japan .................................. 430/178

OTHER PUBLICATIONS

Nonogaki, S. et al., SPIE vol. 539 Advances in Resist Technology and Processing II, 1985, pp. 189–193.
West, P. R. et al., ACS Polymer Preprints 26(2), pp. 337–338, 1985.
Iwayanogi, T. et al., IEEE Transactions on Electron Devices, vol. Ed-28, No. 11, 11/1981, pp. 1306–1310.

Primary Examiner—Charles L. Bowers, Jr.
Attorney, Agent, or Firm—Antonelli, Terry & Wands

[57] ABSTRACT

A photosensitive composition comprising (a) a photosensitive component such as an aromatic diazo compound or an aromatic azide, (b) a polymer and (c) a quaternary alkylammonium salt wherein each straight- or branched-chain alkyl group has 1 to 7 carbon atoms is suitable for producing a positive type or negative type photoresist excellent in contrast and sensitivity in the microlithography of semiconductor elements.

7 Claims, 3 Drawing Sheets

_4,792,516_

PHOTOSENSITIVE COMPOSITION

BACKGROUND OF THE INVENTION

This invention relates to a photosensitive composition. More particularly, it relates to high-resolution positive and negative photosensitive compositions suitable for the microlithography of semiconductor elements and to photoresist obtained from said composition.

In order to improve the performance of semiconductor elements such as integrated circuit (IC) and large scale integration (LSI), it is necessary to improve the resolution in fabrication. For this purpose a specially high resolution is required for the photoresist (photosensitive resist material) used in the working of semiconductor elements.

As one example of methods for working a semiconductor element with a high resolution in conformity with the requirement by using a conventional positive photoresist, there has been proposed a contrast enhancement method, in which a photobleaching material is coated on the positive photoresist to improve the contrast [ACS Polymer Preprints 26(2), 337 (1985)]. This method, however, has disadvantages in that a complicated process for working the element and an extended exposure time are necessary, and the like.

Further, as the conventional negative photoresist with high resolution, mention may be made of a composition comprising an aromatic azide compound and an alkali-soluble phenol-formaldehyde condensation resin in Japanese Patent Publication No. 22,082/70 and a composition comprising an aromatic azide compound and a hydroxystyrene polymer, which is disclosed in IEEE Transactions Electron Devices, vol. ED-28, No. 11, pp. 1306-1310 (1981). These photoresits, however, have their effective exposure wavelengths in an almost ultraviolet region. There is not known a negative photoresist sufficiently sensitive to the g-line (436 nm ray) of a mercury lamp, except for a photoresist described in SPIE Vol. 539, Advances in Resist Technology and Processing II pp. 189-193, (1985). Moreover, with respect to the wavelength of g-line there has never been obtained a photoresist high in both the sensitivity and the contrast. There is an additional problem in that it is far more difficult to synthesize an azide compound highly sensitive to g-line than to synthesize one sensitive to shorter wavelength light such as i-line (365 nm ray).

SUMMARY OF THE INVENTION

An object of this invention is to provide a high-resolution positive type or negative type photosensitive composition.

This invention provides a photosensitive composition comprising (a) a photosensitive component, (b) a polymer, and (c) an alkylammonium compound represented by the formula:

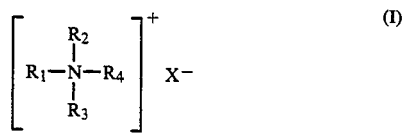

(I)

wherein $R_1$, $R_2$, $R_3$ and $R_4$ are independently a straight- or branched-chain alkyl group having 1 to 7 carbon atoms or at least one hydrogen atom of said alkyl group being substituted by an alkoxy group having 1 to 5 carbon atoms; and X is a chlorine, bromine or iodine atom or a hydroxyl group.

DETAILED DESCRIPTION OF THE PREFERRED EMBODIMENTS

Figure 1:
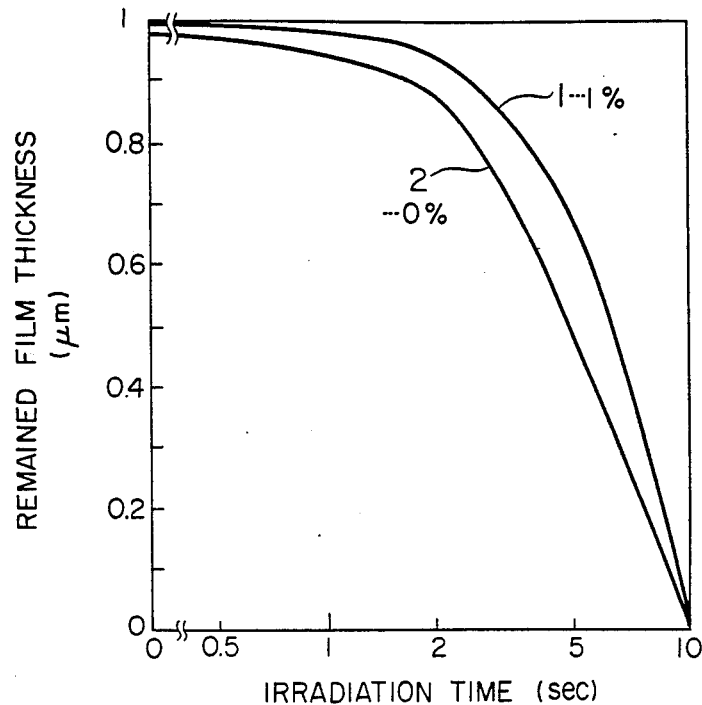
FIG. 1 is a graph showing a relationship between the exposure time and the remained film thickness after development.

The photosensitive composition of this invention comprises (a) a photosensitive component, (b) a polymer and (c) a tetraalkylammonium halide compound or a tetraalkylammonium hydroxide compound (hereinafter both compounds are referred to briefly as "alkylammonium compound") as a third component.

As the photosensitive component (a), there can preferably be used aromatic diazo compounds or aromatic azide compounds. As the polymer (b), there can preferably be used alkali-soluble polymers.

In general, when it is difficult to obtain a photoresist of high sensitivity or when it is necessary to further improve the contrast, a conceivable means for improving the photoresist in sensitivity or contrast is to control the solubility characteristics of the photoresist in the developer. Such development characteristics can be brought about by providing the photoresist with such a property that in the zone where the decomposition degree of a photosensitive component contained in the photoresist is higher than a certain borderline level, the photoresist will be retarded in the dissolution rate, whereas it will be promoted in said rate in the zone where the decomposition degree is lower than said level. In order to obtain such development characteristics, there can be thought of adding and mixing a dissolution inhibitor which is readily detachable from the photoresist surface at a low decomposition degree portion, i.e. a lowly exposed portion in the case of the negative type, and which is hardly detachable from the photoresist surface at a high decomposition degree portion, i.e. a highly exposed portion in the case of the negative type, at the time of development. For instance, a water-soluble quaternary alkylammonium salt having a hydrophobic group is easily released into a developer at the lowly exposed portion which is readily attacked by hydroxyl ions. On the other hand, at the highly exposed portion which is difficult to be attacked by hydroxyl ions, it seems that quaternary ammonium salt is not easily released probably due to the hydrophobic interaction between the salt and the alkali-soluble polymer, thereby protecting the alkali-soluble group of the polymer to retard the dissolution rate of the photoresist.

The present inventors found the characteristics of an alkylammonium compound (quaternary alkylammonium salt) to be such that when it is added to a photosensitive composition for use as a photoresist, a different dissolution inhibitory effect is observed between the exposed zone and the unexposed zone of a photoresist; the dissolution of the photoresist from exposed zones of a negative photoresist is not much inhibited while the dissolution from unexposed zones is inhibited to a large extent. It was further found that when such a photosensitive composition is adapted to positive type and negative type photoresists, the contrast is improved and the improvement in sensitivity is also expected owing to the dissolution inhibitory effect of the third constituent. The present invention is based on the above findings.

The alkylammonium compound used as the component (c) in the photosensitvve composition of this invention is represented by the formula:

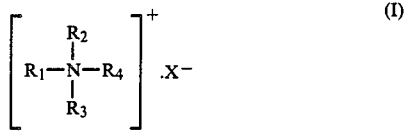

wherein $R_1$, $R_2$, $R_3$ and $R_4$ are independently a straight- or branched-chain alkyl group having 1 to 7 carbon atoms, or at least one hydrogen atom of said alkyl group being substituted by an alkoxy group having 1 to 5 carbon atoms; and X is a chlorine, bromine or iodine atom, or a hydroxyl group.

The amount of the alkylammonium compound contained in the present photosensitive composition is preferably 0.1 to 10%, more preferably 1 to 4% by weight based on the total solids content. If the amount of the alkylammonium compound is less than 0.1% by weight, the effect upon the improvement in sensitivity and contrast is hardly observable, while if it exceeds 10% by weight, the alkylammonium compound is deposited, resulting in deteriorating the characteristics of the coating layer.

Examples of the aromatic diazo compounds, which are the photosensitive component (a) contained in the positive photosensitive composition of this invention, are quinone diazides such as o-quinonediazide sulfonyloxy acid ester, 1,2-naphthoquinonediazide-5-sulfonic acid ester, 1,2-naphthoquinonediazido-4-sulfonic acid ester, etc. The content of this compound is preferably 5 to 30%, more preferably 10 to 25% by weight based on the total solids content of the photosensitive composition. If the content of this aromatic diazo compound is less than 5% by weight, the sensitivity becomes inferior, whereas if it exceeds 30% by weight, the characteristics of the coating layer is deteriorated.

Examples of the aromatic azide compounds, which are the photosensitive component (a) of the negative photosensitive composition of this invention, are those compounds which are represented by the formula:

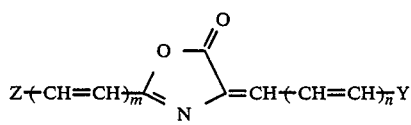

wherein Z and Y are independently an aromatic substituent, or a heterocyclic substituent, e.g., phenyl, methoxyphenyl, acetoxyphenyl, aminophenyl, (acetylamino)phenyl, (dimethylamino)phenyl, pyridyl, (N-phenylsulfonylamino)phenyl, thienyl, and furyl groups, at least one of which has an azido group; and n and m are independently 0 or 1. There can also be used condensation compounds of aromatic aldehyde compounds with ketones or N-acylglycines wherein at least one aromatic group contains an azido group, e.g., 3-(p-azidostyryl)-5,5-dimethyl-2-cyclohexene-1-one, 3-(4'-p-azidophenyl-1',3'-butadienyl)-5,5-dimethyl-2-cyclohexen-1-one, 4-azido-4'-methoxychalcone, and 2,6-bis(4'-azidobenzylidene)cyclohexanone.

The aromatic azide compound content is preferably 5 to 30%, more preferably 10 to 25%, by weight based on total solids content of the photosensitvve composition. If the aromatic azide compound content is less than 5% by weight, the sensitivity of the photoresist becomes inferior, while if it exceeds 30% by weight, the characteristics of the coating layer become inferior.

The alkali-soluble polymers contained in the positive type or negative type photosensitive composition of this invention are preferably alkali-soluble polymers having phenolic hydroxyl groups, such as, for example, cresol novolac resins, hydroxystyrene polymers or copolymers thereof, partially modified resins derived from said polymers, and phenol-formaldehyde condensation resins. These polymers can be used alone or as a mixture thereof, or in admixtures with low-molecular hydroxyphenylsiloxane.

The present invention is further illustrated in detail below with reference to Examples and Drawings.

EXAMPLE 1

A cresol novolac resin, 1,2-naphthoquinonediazido-5-sulfonic acid ester, and tetra-n-amylammonium chloride in a weight ratio of 86:13:1 were dissolved in Cellosolve acetate. The solution was coated on a silicon wafer and baked to form a film of 1 μm in thickness. The film was exposed for 10 seconds to a 600-W Hg-Xe lamp at a distance of 40 cm. After exposure, the film was developed for a prescribed period of time in a 2.38-% aqueous solution of tetramethylammonium hydroxide. In FIG. 1, are shown the curves representing the relation between the exposure time (second) and the remained film thickness after development, that is, the sensitivity curves. In FIG. 1, curve 1 is the sensitivity curve for the photosensitive composition containing 1% of tetra-n-amylammonium chloride and developed for 27 seconds; the curve 2 is the sensitivity curve for the photosensitive composition containin no alkylammonium compound and developed for 16 seconds. The addition of tetra-n-amylammonium chloride, which is one of the alkylammonium compounds, made it possible to improve the contrast from 1.4 to 2.3, while the sensitivity being retained, and to improve the film loss in unexposed areas from 0.03 to 0.01 μm.

Substantially the same results as those described above were obtained when tetra-n-amylmmonium bromide, iodide, or hydroxide was used in place of the tetra-n-amylammonium chloride.

EXAMPLE 2

Figure 2:
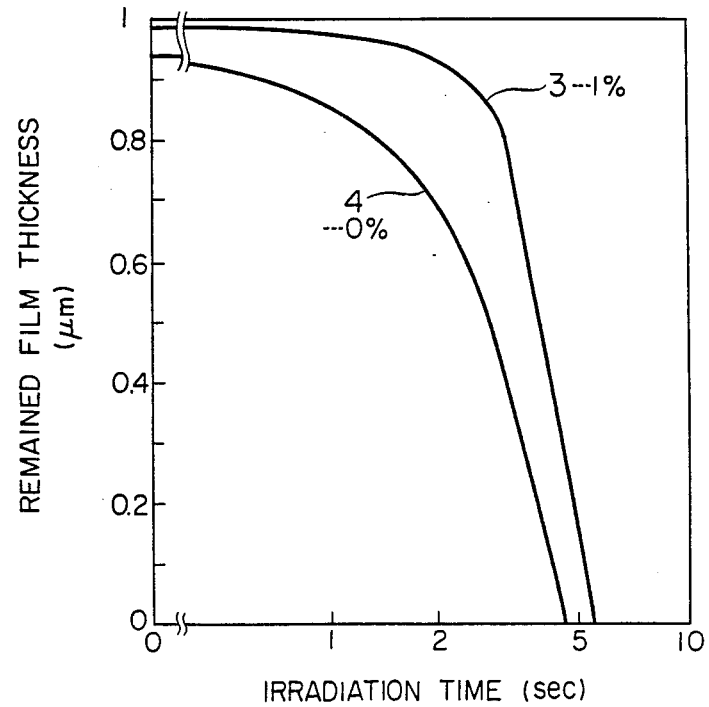
FIGS. 2, 3, 4 and 5 are graphs showing photosensitive properties in Examples 2, 3, 4 and 5, respectively. In the Drawings, numerical values are the amounts added of tetra-n-amylammonium chloride.

To a commercial positive photoresist (OFPR-5000 of Tokyo Ohka Kogyo Co.), was added 1% (based on the weight of total solids content of OFPR-5000) of tetra-n-amylammonium chloride. By using the solution of this positive photoresist, a film was formed under the same conditions as those in Example 1. The film was exposed for a prescribed period of time and developed. In FIG. 2, are shown the sensitivity curves. The curve 3 is the sensitivity curve of the film of photosensitive composition containing 1% of tetra-n-amylammonium chloride and developed for 30 seconds; the curve 4 is that of the commercial photoactive composition containing no alkylammonium compound. As is apparent from FIG. 2, the addition of an alkylammonium compound improved the contrast from 2.2 to 3.4 and the film loss in unexposed areas from 0.5 to 0.2 μm.

EXAMPLE 3

Figure 3:
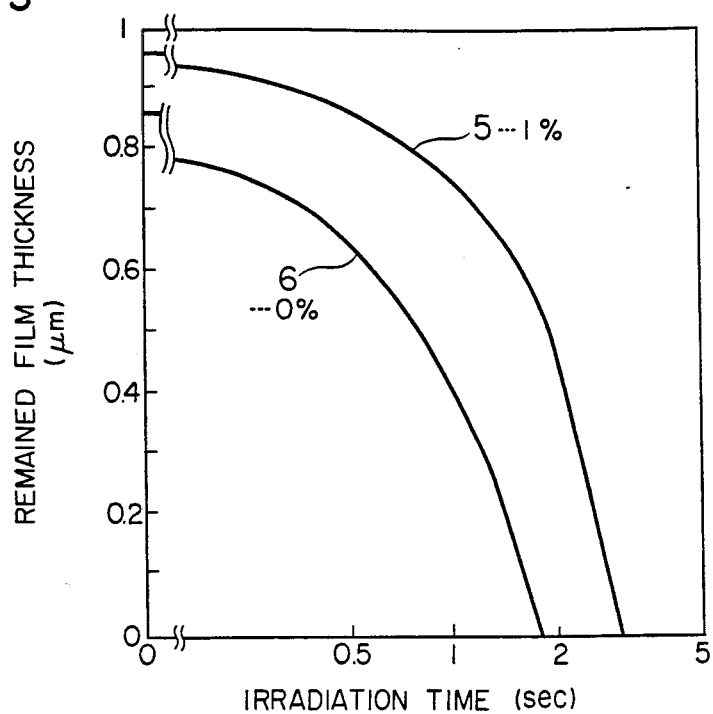

A cresol novolac resin, 1,2-naphthoquinonediazido-5-sulfonic acid compound, polyphenylsilsesquioxane [weight average molecular weight $\overline{M}w=998$; $\overline{M}w/\overline{M}n$ (number average molecular weight)$=1.15$], cis-(1,3,5,7-tetrahydroxy)-1,3,5,7-tetraphenylcyclotetrasiloxane, and tetra-n-amylammonium chloride in a weight ratio of 45:11:14:28:1 were dissolved in Cellosolve acetate. By using the resulting photoresist solution a film was formed under the same conditions as those in Example 1. The film was exposed for a prescribed period of time and developed. FIG. 3 shows the sensitivity curves, curve 5 of which is that of the photoresist containing 1% of tetra-n-amylammonium chloride and developed for 20 seconds and the curve 6 is that of the photoresist containing no alkylammonium compound. The addition of the alkylammonium compound improved the contrast from 1.8 to 2.5 and the film loss in unexposed areas from 1.4 to 0.4 μm.

EXAMPLE 4

The aromatic azide compounds used in the present Example were as shown in Table 1.

TABLE 1

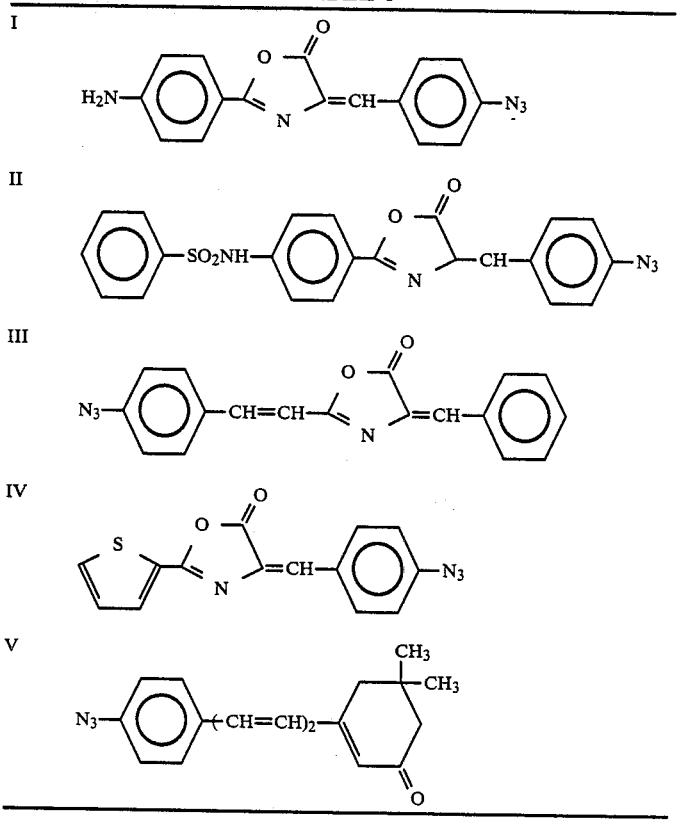

Photoresist solutions of the following formulation were prepared.

| | |
|---|---|
| Polyvinylphenol (Maruzen resin M of Maruzen Oil Co.) | 10.00 g |
| Aromatic azide compound I | 1.56 g |
| Aromatic azide compound II | 0.98 g |
| Tetra-n-amylammonium chloride | Prescribed amount |
| Cyclohexanone | 38.2 g |

The prescribed amount of tetra-n-amylammonium chloride was 0.0, 0.16, 0.40, or 0.79% by weight based on the total solids content of the photoresist solution.

Figure 4:
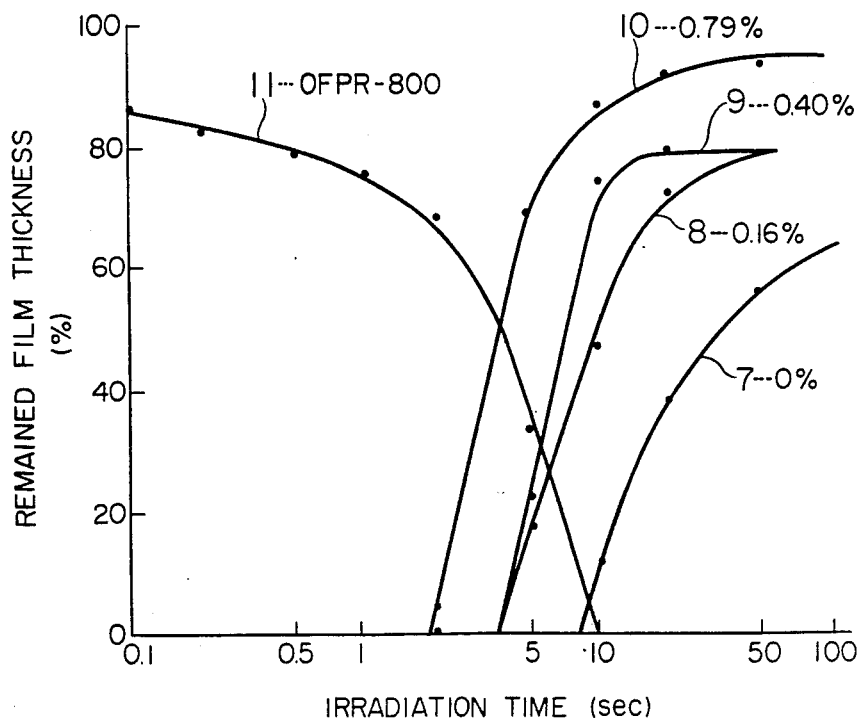

Each photoresist solution was applied to a silicon wafer of 3 inches in diameter by spin coating at 4000 rpm, and then heated at 80° C. for 20 minutes to evaporate the cyclohexanone, leaving behind a photoresist film of about 1.3 μm in thickness. The film was exposed in monochronized 436 nm light pattern through an interference filter to a 600-W xenon-mercury lamp at a distance of 40 cm. The exposed film was developed in a 1% aqueous solution of tetramethylammonium hydroxide for a prescribed period of time which was about 1.3 times the time span necessary for the dissolution of unexposed areas. In FIG. 4, are shown the relation between the exposure time (second) and the remaining film thickness (%), that is, sensitivity curves. In FIG. 4, the curves 7, 8, 9 and 10 correspond to the cases wherein the amount added of the alkylammonium compound and the time of development were 0% and 73 seconds, 0.16% and 74 seconds, 0.40% and 90 seconds, and 0.79% and 90 seconds, respectively. The curve 11 represents the sensitivity curve of comparative example wherein a commercial positive photoresist (OFPR-800 of Tokyo Ohka Kogyo Co.) was exposed under the same conditions as those described above and developed at 23° C. for 60 seconds. As is apparent from FIG. 4 the addition of tetra-n-amylammonium chloride, which is one of the alkylammonium compounds, to a photoresist comprising an aromatic azide compound and an alkali-soluble polymer improved the contrast and the sensitivity.

EXAMPLE 5

Using the aromatic azide compounds shown in Table 1, photoresist solutions of the following formulation were prepared.

| | |
|---|---|
| Polyvinylphenol (Maruzen Resin M of Maruzen Oil Co.) | 10.00 g |
| Aromatic azide compound II | 1.07 g |
| Aromatic azide compound III | 0.81 g |
| Aromatic azide compound IV | 0.62 g |
| Tetra-n-amylammonium chloride | Prescribed amount |
| Cyclohexanone | 43.9 g |

The prescribed amount of tetra-n-amylammonium chloride was 0.0, 0.79, or 3.4% by weight based on the total solids content of the photoresist solution.

Figure 5:
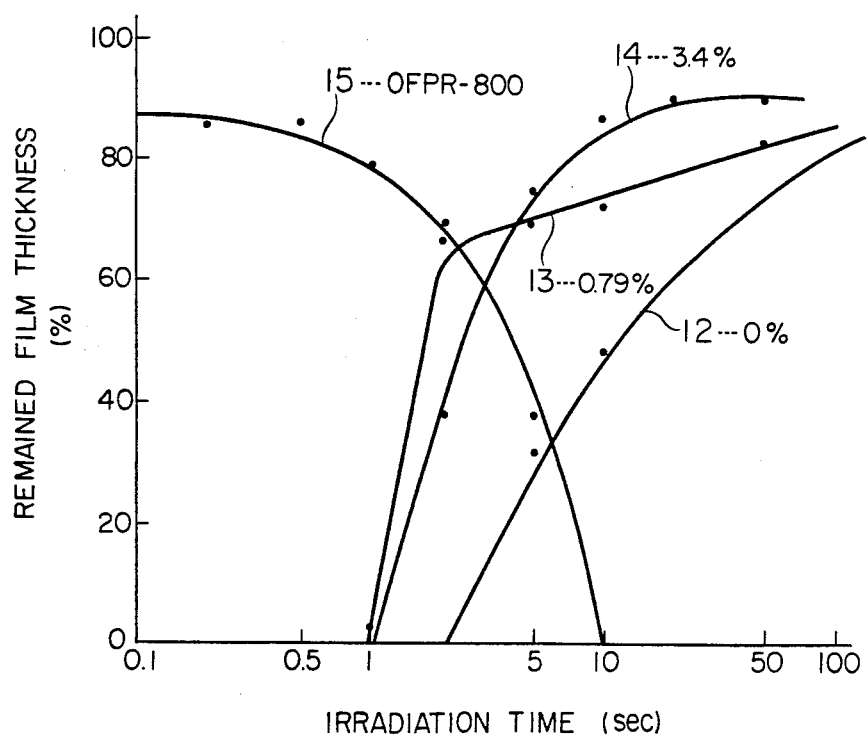

Each photoresist solution of the above formulation was applied to a silicon wafer of 3 inches in diameter by spin coating at 3000 rpm, and then heated at 80° C. for 20 minutes to evaporate the cyclohexanone, leaving behind a photoresist film of about 1.0 μm in thickness. The film was exposed for a prescribed period of time under the same conditions as those in Example 4. The exposed film was developed in an aqueous tetramethylammonium solution of the prescribed concentration for a prescribed period of time at 23° C. The prescribed development time was about 1.3 times of the time necessary for the dissolution of unexposed areas. In FIG. 5, are shown sensitivity curves for each amount added of the tetra-n-amylammonium chloride. In FIG. 5, the curves 12, 13 and 14 correspond respectively to the cases wherein the amount added of the tetra-n-amylammonium chloride, the alkali concentration, and the development time were respectively 0%, 1.0% and 40 seconds; 0.79%, 1.0% and 120 seconds; and 3.4%, 1.5% and 70 seconds. The curve 15 represents the sensitivity curve of comparative example wherein the commercial photoresist OFPR-800 was exposed and developed under the same conditions as those in Example 4. As is apparent from FIG. 5, the addition of tetra-n-amylammonium chloride, which is one of the alkylammonium compounds, to a photoresist comprising an aromatic azide compound and an alkali-soluble polymer improved the contrast and the sensitivity.

EXAMPLE 6

It was confirmed that the contrast and sensitivity of photoresists were improved similarly to Examples 4 and 5 by the addition of alkylammonium compounds such as tetra-n-amylammonium chloride to the photoresists of the alkali-soluble polymer type containing the azide compound V shown in Table 1 or other condensates of aromatic aldehydes with ketones such as 3-(p-azidostyryl)-5,5-dimethyl-2-cyclohexene-1-one, 3-(p-azidophenyl-1',3'-butadienyl)- 5,5-dimethyl-2-cyclohexen-1-one, 4-azido-4'-methoxychalcone, 2,6-bis(4'-azidobenzylidene)cyclohexanone.

Substantially the same results as those described above were obtained when tetra-n-amylammonium bromide, iodide, or hydroxide was used in place of the tetra-n-amylammonium chloride.

EXAMPLE 7

A cresol novolac resin, 1,2-naphthoquinonediazido-5-sulfonic acid compound, and tetraethylammonium chloride in a weight ratio of 87:10:3 were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 30 seconds in a 2.38% aqueous solution of tetramethylammonium hydroxide.

For comparison, a cresol novolac resin and 1,2-naphthoquinonediazido-5-sulfonic acid compound in a weight ratio of 90:10 were dissolved in Cellosolve acetate. The film from this solution was exposed and developed in the same manner as described above.

It was found that the addition of tetraethylammonium chloride had improved the contrast from 1.2 to 1.5.

EXAMPLE 8

A cresol novolac resin, 1,2-naphthoquinonediazido-5-sulfonic acid compound, and tetra-n-hexylammonium chloride in a weight ratio of 88:10:2 were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 60 seconds in a 2.38% aqueous solution of tetramethylammonium hydroxide.

For comparison, a cresol novolac resin and 1,2-naphthoquinondiazido-5-sulfonic acid compound in a weight ratio of 90:10 were dissolved in Cellosolve acetate. The film from this solution was exposed and developed under the same condition as those described above.

It was found that the addition of tetra-n-hexylammonium chloride had improved the contrast from 1.2 to 1.7 and the film loss in the unexposed areas from 0.05 to 0.01 μm.

EXAMPLE 9

A cresol novolac resin, 1,2-naphthoquinonediazido-5-sulfonic acid compound, and tetraethylammonium iodide in a ratio of 87:10:3 by weight were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 30 seconds in a 2.38% aqueous solution of tetramethylammonium hydroxide.

For comparison, a cresol novolac resin and 1,2-naphthoquinonediazido-5-sulfonic acid compound in a weight ratio of 90:10 were dissolved in Cellosolve acetate. The film from this solution was exposed and developed under the same conditions as those described above.

It was found that the addition of tetraethylammonium iodide had improved the contrast from 1.2 to 1.5.

EXAMPLE 10

A cresol novolac resin, 1,2-naphthoquinonediazido5-sulfonic acid compound, and 2-hydroxymethyltrimethylammonium hydroxide in a weight ratio of 88:10:2 were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 40 seconds in a 2.38% aqueous solution of tetramethylammonium hydroxide.

For comparison, a cresol novolac resin and 1,2-naphthoquinonediazido-5-sulfonic acid compound in a weight ratio of 90:10 were dissolved in Cellosolve acetate. The film from this solution was exposed and developed in the same manner as that described above.

It was found that the addition of 2-hydroxymethyltrimethylammonium hydroxide had improved the contrast from 1.2 to 1.8.

COMPARATIVE EXAMPLE 1

A cresol novolac resin, 1,2-naphthoquinonediazido-5-sulfonic acid compound, and benzyltrimethylammonium chloride in a weight ratio of 88:10:2 were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 60 seconds in a 2.38% aqueous tetramethylammonium hydroxide solution.

For comparison, a sample containing no benzyltrimethylammonium chloride was exposed and developed under the same conditions as those described above.

It was found that the addition of benzyltrimethylammonium chloride had increased the film loss in the unexposed areas from 0.05 to 0.3 μm.

COMPARATIVE EXAMPLE 2

A cresol novolac resin, 1,2-naphthoquinonediazido-5-sulfonic acid compound, and hexadecyltrimethylammonium bromide in a weight ratio of 88:10:2 were dissolved in Cellosolve acetate. The resulting solution was coated on a silicon wafer and baked to form a film of 1 μm in thickness. The film was exposed for 10 seconds to a 600-W Hg-Xe lamp at a distance of 40 cm. The exposed film was developed for 60 seconds in a 2.38% aqueous tetramethylammonium hydroxide solution.

For comparison, a sample containing no hexadecyltrimethylammonium bromide was exposed and developed under the same conditions as those described above.

It was found that the addition of hexadecyltrimethylammonium bromide had decreased the contrast from 1.2 to 0.8.

As fully described in the foregoing, by the incorporation of a prescribed amount of an alkylammonium compound into a photosensitive composition for positive photoresists comprising an aromatic diazo compound and an alkali-soluble polymer or a photosensitive composition for negative photoresist comprising an aromatic azide compound and an alkali-soluble polymer, it is possible to improve both the sensitivity and the contrast of the photoresist and there is obtained a photoresist of high sensitivity and high contrast particularly suitable for the fabrication of a semiconductor element with fine resolution.

What is claimed is:

1. A photosensitive composition comprising an admixture containing (a) an aromatic azide compound represented by the formula:

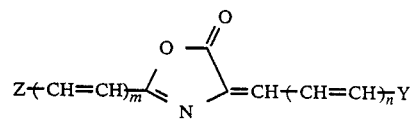

wherein Z and Y are independently an aromatic substituent or a heterocyclic substituent, at least one of said aromatic substituents or heterocyclic substituents having a photosensitive azido group; and n and m are independently 0 or 1, (b) an alkali-soluble polymer and (c) an alkylammonium compound represented by the formula:

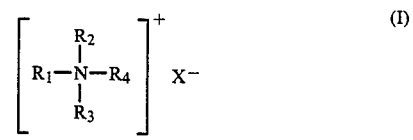

wherein $R_1$, $R_2$, $R_3$ and $R_4$ are independently a straight- or branched-chain alkyl group having 1 to 7 carbon atoms or at least one hydrogen atom of said alkyl group being substituted by an alkoxy group having 1 to 5 carbon atoms; and X is a chlorine, bromine or iodine atom or a hydroxyl group; (a), (b) and (c) being present in amounts sufficient to provide a negative type photoresist film.

2. A photosensitive composition according to claim 1, wherein $R_1$, $R_2$, $R_3$ and $R_4$ of the alkylammonium compound represented by the formula (1) are independently a straight- or branched-chain alkyl group having 1 to 7 carbon atoms.

3. A photosensitive composition according to claim 1, wherein X of the alkylammonium compound represented by the formula (1) is a chlorine atom.

4. A photosensititve composition according to claim 4, wherein $R_1$, $R_2$, $R_3$ and $R_4$ of the alkylammonium compound represented by the formula (1) are independently a straight- or branched-chain alkyl group having 5 carbon atoms.

5. A photosensitive composition according to claim 1, wherein the content of the alkylammonium compound represented by the formula (1) is in the range of from 0.1 to 10% by weight based on total solids content of the photosensitive composition.

6. A photosensitive composition according to claim 5, wherein the aromatic azide compound content is in the range of from 5 to 30% by weight based on total solids content of the photosensitive composition.

7. A photosensitive composition according to claim 1, wherein the alkali-soluble polymer is an alkali-soluble polymer having phenolic hydroxy groups, and is at least one member selected from the group consisting of cresol novolac resins, hydroxystyrene polymers and copolymers thereof, partially modified products of these polymers, and condensation products of phenols with formaldehyde.

* * * * *